(12) United States Patent
Shajii et al.

(10) Patent No.: US 8,689,822 B2
(45) Date of Patent: *Apr. 8, 2014

(54) PRESSURE REGULATION IN REMOTE ZONES

(75) Inventors: Ali Shajii, Canton, MA (US); Siddharth P. Nagarkatti, Acton, MA (US); Gordon Hill, Arlington, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/271,447

(22) Filed: Oct. 12, 2011

(65) Prior Publication Data

US 2012/0202408 A1 Aug. 9, 2012

Related U.S. Application Data

(60) Division of application No. 11/333,142, filed on Jan. 17, 2006, now Pat. No. 8,037,896, which is a continuation-in-part of application No. 10/796,723, filed on Mar. 9, 2004, now Pat. No. 6,986,359.

(51) Int. Cl.
    *F16K 31/02* (2006.01)
(52) U.S. Cl.
    USPC .............. 137/487.5; 137/596.16; 137/599.09; 137/601.01; 137/601.14; 137/870
(58) Field of Classification Search
    USPC .............. 137/487.5, 14, 102, 596.16, 601.01, 137/601.14, 870
    See application file for complete search history.

(56) References Cited

U.S. PATENT DOCUMENTS

| 4,456,038 A | 6/1984 | Gwaltney et al. |
| 4,961,441 A | 10/1990 | Salter |
| 5,325,884 A | 7/1994 | Mirel et al. |

(Continued)

FOREIGN PATENT DOCUMENTS

| DE | 19956553 | 5/2001 |
| DE | 69807780 T2 | 5/2003 |

(Continued)

OTHER PUBLICATIONS

Response filed to the Examination Report in related United Kingdom Patent Application No. GB0811130.4, dated Feb. 1, 2011.

(Continued)

*Primary Examiner* — William McCalister
(74) *Attorney, Agent, or Firm* — McDermott Will & Emery LLP

(57) ABSTRACT

A pressure control system remotely controls pressure within one or more remote zones, each respectively connected to an enclosure through a conduit, by controlling flow of a fluid into and out of each enclosure. The pressure of the fluid is measured within each enclosure. An estimated pressure within each zone is computed, as a function of the measured pressure in the enclosure and known characteristics of the conduit and the zone. For each zone, an inlet proportional valve and an outlet proportional valve of each enclosure is operated so as to control the input flow rate of the fluid into the respective enclosure and the output flow rate of the fluid out of the enclosure as a function of a pressure set point and the estimated pressure, thereby regulating pressure within the zone in accordance with the pressure set point.

6 Claims, 2 Drawing Sheets

(56) References Cited

U.S. PATENT DOCUMENTS

| | | |
|---|---|---|
| 5,443,087 A | 8/1995 | Myles |
| 5,551,770 A | 9/1996 | Hrovat et al. |
| 5,630,798 A | 5/1997 | Beiser et al. |
| 5,762,539 A | 6/1998 | Nakashiba et al. |
| 5,840,060 A | 11/1998 | Beiser et al. |
| 5,916,016 A | 6/1999 | Bothra |
| 5,964,653 A | 10/1999 | Perlov et al. |
| 5,980,361 A | 11/1999 | Muller et al. |
| 6,277,009 B1 | 8/2001 | Chen et al. |
| 6,435,956 B1 | 8/2002 | Ohwada et al. |
| 6,506,105 B1 | 1/2003 | Kajiwara et al. |
| 6,568,416 B2 * | 5/2003 | Tucker et al. ............ 137/14 |
| 6,722,946 B2 | 4/2004 | Talieh et al. |
| 6,758,233 B2 | 7/2004 | Sulatisky et al. |
| 6,766,260 B2 | 7/2004 | Ambrosina et al. |
| 2002/0142704 A1 | 10/2002 | Hu et al. |
| 2004/0041470 A1 | 3/2004 | Imamura |
| 2004/0118403 A1 | 6/2004 | O'Connor et al. |
| 2005/0189018 A1 | 9/2005 | Brodeur et al. |
| 2005/0199287 A1 | 9/2005 | Shajii et al. |

FOREIGN PATENT DOCUMENTS

| | | |
|---|---|---|
| EP | 0847835 | 6/1998 |
| JP | 61-170633 | 1/1986 |
| TW | 200401180 A | 1/2004 |
| WO | 00/51782 | 9/2000 |
| WO | 2004010086 A2 | 1/2004 |

OTHER PUBLICATIONS

Examination Report received in corresponding Great Britain Application No. GB0811130.4 dated Aug. 2, 2010.
Notification of Grant from related United Kingdom Patent Application No. GB0811130.4, dated Apr. 5, 2011, 2 pages.
PCT International Search Report for Related PCT Application No. PCT/US2006/043692.
PCT Written Opinion of the International Search Authority for Related PCT Application No. PCT/US2006/043692.
English Version of Office Action dated Jun. 21, 2013 from Corresponding German Patent Application No. 112005000473.2.
Office Action dated Dec. 24, 2013 from Corresponding Japanese Patent Application No. 2012-268442.

* cited by examiner

PRESSURE REGULATION IN REMOTE ZONES

CROSS-REFERENCE TO RELATED APPLICATION

The present application is a divisional of, and claims priority to, the following U.S. patent application: co-pending application Ser. No. 11/333,142 filed on Jan. 17, 2006, entitled "Pressure Regulation in Remote Zones"; the entire contents of which are incorporated herein by reference.

BACKGROUND

In some applications, it may be necessary to regulate the pressure within remotely located zones. For example, some machines and equipment may include chambers that are pressurized or evacuated during operation of the equipment. Examples of such machines may include, but are not limited to, chemical mechanical polishing (CMP) machines.

A pressure sensor inside a measurement chamber may only measure pressure within that measurement chamber, not within a zone that is remotely located with respect to the sensor. As a result, a pressure control system that only uses pressure measurements by a pressure sensor located inside the measurement chamber may have to assume that the pressure in the measurement chamber to be equal to the pressure in the remote zone. Often, however, the pressure in the measurement chamber may not be equal to the zone pressure. For example, when localized pressure transients occur in the measurement chamber, the pressure in the measurement chamber may not be equal to the zone pressure. This may result in a substantial degradation of the performance of the pressure control system.

Accordingly, there is a need for systems and methods that allow the pressure within remotely located zones to be controlled accurately.

SUMMARY

A system for remotely controlling pressure within a zone includes a pressure sensor, a valve system, a zone pressure estimator, and a controller. The pressure sensor is configured to measure pressure within an enclosure (e.g. measurement chamber) connectable to the zone through a conduit and located remote from the zone. The valve system is configured to regulate flow of a fluid into and out of the enclosure and through the conduit into the zone. The valve system includes at least an inlet proportional valve configured to regulate an input flow rate of the fluid into the enclosure, and an outlet proportional valve configured to regulate an output flow rate of the fluid out of the enclosure. The zone pressure estimator is configured to compute an estimated pressure within the zone as a function of the pressure measured by the pressure sensor, and as a function of known characteristics of the conduit. The controller is configured to regulate pressure within the zone by operating the inlet proportional valve and the outlet proportional valve so as to control the input flow rate and the output flow rate as a function of the estimated pressure from the zone pressure estimator and a pressure set point for the zone.

A system is described for remotely controlling pressure within each of i zones respectively connectable to i enclosures through conduits i, by controlling flow of a fluid into and out of each enclosure i, and through each conduit i into each zone i ($i=1, \ldots, N$). The system includes a pressure measurement system, a valve system, a zone pressure estimator, and a controller. The pressure measurement system is configured to measure pressure of the fluid in each of the i enclosures. The valve system includes, for each enclosure i, at least one inlet proportional valve configured to regulate an input flow rate of the fluid into the enclosure i, and at least one outlet proportional valve configured to regulate an output flow rate of the fluid out of the enclosure i.

The zone pressure estimator is coupled to the pressure measurement system. The zone pressure estimator is configured to, for each zone i, receive a measured pressure in the enclosure i from the pressure sensor system, and compute an estimated pressure within the zone i as a function of the measured pressure in the enclosure i, and as a function of known characteristics of the conduit i and the zone i. The controller is configured to control pressure within each zone i by operating the inlet proportional valve and outlet proportional valve of each enclosure i so as to control the input flow rate of the fluid into the enclosure i and the outlet flow rate of the fluid out of the enclosure i as a function of a pressure set point for the zone i and the estimated pressure within the zone i from the zone pressure estimator.

A method is described for remotely controlling pressure within each of i zones respectively connectable to i enclosures through i conduits, by controlling flow of a fluid into and out of each enclosure i and through each conduit i into each zone i ($i=1, \ldots N$). The method includes measuring pressure of the fluid within each of the i enclosures. The method further includes computing an estimated pressure within each zone i as a function of the measured pressure in the enclosure i, and as a function of known characteristics of the conduit i and the zone i. The method further includes, for each zone i, operating an inlet proportional valve and an outlet proportional valve of each enclosure i so as to control the input flow rate of the fluid into the enclosure i and the output flow rate of the fluid out of the enclosure i as a function of a pressure set point for the zone i and the estimated pressure within the zone i, thereby regulating pressure within the zone i in accordance with the pressure set point.

DETAILED DESCRIPTION

In the present disclosure, the term zone shall mean an enclosed volume. A system and method are described for controlling pressure in remotes zones using an observer-based solution that accurately estimates the pressure of each remote zone whose pressure is to be controlled. By using the estimated pressure of the remote zones in the pressure control system, the closed-loop control performance may be significantly improved. For example, localized pressure transients that occur in the measurement chamber but do not occur in the remote zone itself may be overcome.

Figure 1:
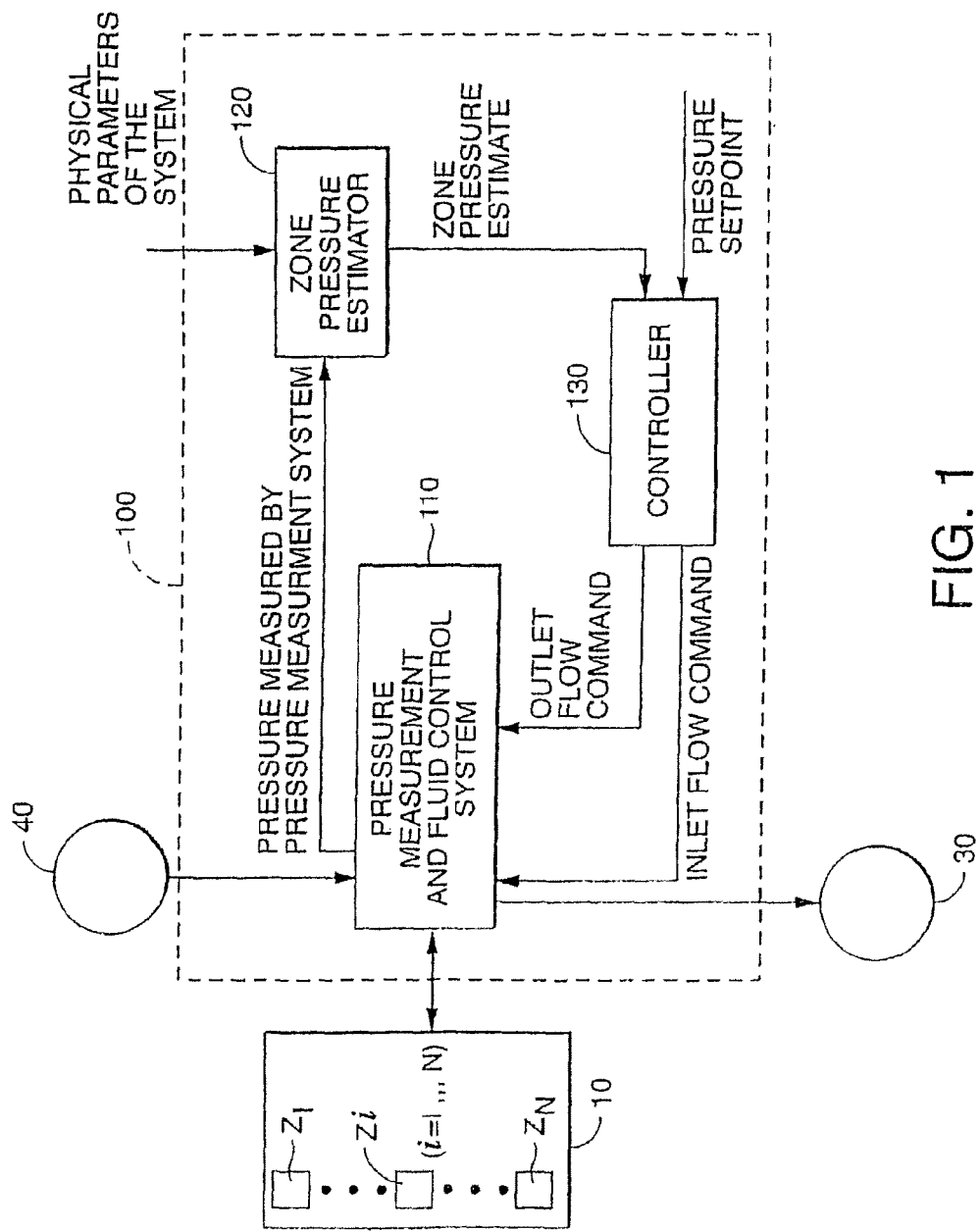
FIG. 1 is an overall functional block diagram that illustrates a pressure control system that regulates pressure in one or more remote zones, in accordance with one embodiment of the description in this disclosure.

FIG. 1 is a functional block diagram that illustrates a pressure control system 100 that regulates pressure in one or more remote zones $Z_i$ ($i=1, \ldots N$), in accordance with one embodiment of the description in this disclosure. As seen in FIG. 1, all the zones $Z_i$ are fed by a single pressurized fluid source 40 and dump into a single vacuum exhaust 30. In overview, the pressure control system 100 may include a pressure measurement and fluid control system 110 (shown in more detail in FIG. 2), a zone pressure estimator 120, and a controller 130.

The pressure control system 100 may remotely control pressure in each remote zone $Z_i$, using a zone pressure estimator 120. to estimate the pressure within the remote zone $Z_i$ based on the measured pressure inside an enclosure $b_i$ (shown in FIG. 2) connected to the zone $Z_i$ through a conduit $F_i$ (shown in FIG. 2), and by controlling flow of a fluid into and out of the enclosure based on the estimated pressure from the zone pressure estimator 120. Typically, the enclosures may be pressure measurement chambers, although any other type of enclosed volume that can enclose the fluid therewithin can be used.

The pressure measurement and fluid control system 110 may include a pressure measurement system, and a fluid control system. The pressure measurement system in 110 may include, for example, a plurality of pressure sensors, each connected to an enclosure, and configured to measure pressure inside the enclosure. A fluid control system in 110 may include a valve system that controls flow rate of fluid into and out of each enclosure.

The zone pressure estimator 120 may receive pressure measurements from the pressure measurement system, and may also receive (e.g. from a customer, an operator, or other personnel) physical parameters of the system 100, which may include, for example, known characteristics of the conduit and the zone. The zone pressure estimator 120 may further be configured to use the pressure measurements and the physical parameters to calculate and provide pressure estimates for each zone using computational methods described in detail below.

The controller 130 may also receive pressure set points for each of the remote zones $Z_i$, and may use the zone pressure estimates (from the zone pressure estimator 120) and the pressure set points to control the fluid control system. In particular, the controller 130 may control the valve system so that the flow rate of the fluid into and out of each enclosure is such that pressure within each zone is regulated in accordance with the pressure set points.

In the illustrated embodiment, the valve system may include, for each enclosure, at least one an inlet proportional valve configured to regulate an input flow rate of the fluid into the enclosure, and an outlet proportional valve configured to regulate an output flow rate of the fluid out of the enclosure. The controller 130 may be configured to regulate pressure within each zone by operating the inlet proportional valve and the outlet proportional valve so as to control the input flow rate and the output flow rate as a function of the estimated pressure from the zone pressure estimator and of a pressure set point.

As shown schematically in FIG. 1, the controller 130 may send an input flow command signal an output flow command signal to the valve system within block 110 (described in more detail in FIG. 2), so as to control the input flow rate and the output flow rate according to the input flow command signal and the output flow command signal, respectively. In one exemplary embodiment, the controller may be configured to effect PI (Proportional-Integral) control (described in more detail below) of the input flow rate and the output flow rate into and out of each enclosure, although other control methods may also be used. While the control system and method is described as a proportional-plus-integral (PI) type control system and method, many other types of control systems and methods can be used, including but not limited to proportional, integral, proportional-plus-derivative (PD), and-sroportional-plus-integral-plus-derivative (PID) types of feedback control systems and methods.

Figure 2:
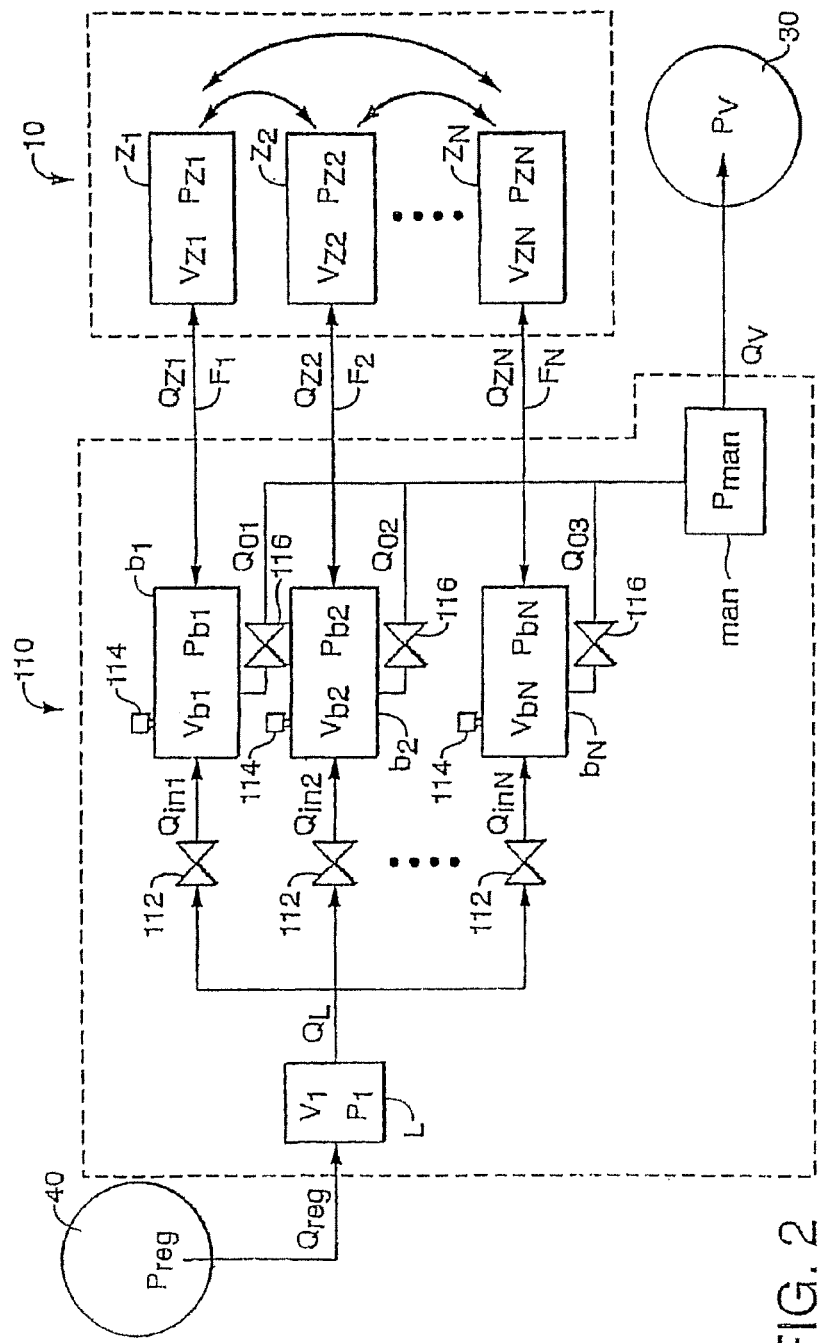
FIG. 2 illustrates in more detail a plurality i of zones respectively connectable to i enclosures through i conduits i ($i=1, \ldots, N$), and a pressure measurement and fluid control system used in one embodiment of the pressure control system described in this disclosure.

FIG. 2 illustrates in more detail a plurality i of zones respectively connectable to i enclosures $b_i$ through i conduits $F_i$ (i=1, ..., N), the pressure in each zone i regulated by controlling flow of a fluid into and out of each enclosure i and through each conduit i into each zone i. FIG. 2 also illustrates a pressure measurement and fluid control system used in one embodiment of the pressure control system described in this disclosure.

As shown in FIG. 2, the remote zones $Z_i$, shown within block 10 in FIG. 1, may each be respectively connectable to a plurality i of enclosures $b_i$ through a plurality i of conduits $F_i$ (i=1, ..., N). The pressure measurement and fluid control system 110 includes the plurality i of enclosures or measurement chambers "$b_i$," where i=1 to N and corresponds to the number of remote zones $Z_i$. Each measurement chamber $b_i$ includes an inlet valve 112 configured to regulate input flow rate of the fluid into $b_i$, and an outlet valve 116 configured to regulate output flow rate of the fluid out of $b_i$. Each measurement chamber $b_i$ is located along a fluid flow line that goes from the pressurized fluid source 40 through an inlet manifold "L" into the inlet valve 112 for the enclosure $b_i$, and out of the outlet valve 116 for the enclosure $b_i$ through a flow constrictor manifold (shown as "man" in FIG. 2) to the vacuum exhaust 30. A pressure sensor 114 (typically a transducer) is operatively connected to each measurement chamber $b_i$ to measure the pressure within $b_i$.

As described earlier, all the zones $Z_i$ are fed by a single pressurized fluid source 40 and dump into a single vacuum exhaust 30. In one embodiment, the flow constrictor manifold may be a venturi manifold, although other types of flow constrictors may also be used. The remote zones $Z_i$ (shown inside block 10 in FIG. 2) may have rigid or flexible walls, and may be coupled or non-coupled. The remote zones with flexible walls may have volumes that can expand and contract. The volumes of the zones with flexible walls may interact with each other, e.g. push against each other.

The coupling between the various zones $Z_i$ may occur in a number of ways. Volumetric coupling at a zone that has walls that are flexible (and thus can expand and contract) may occur due to volume expansion/contraction and volume-to-volume interaction. The interaction may occur, for example, by one zone expanding and pushing against another zone thereby increasing pressure within the second zone.

Outlet coupling at the exhaust may occur if the vacuum pressure level drifts, cause outlet flows to change, and in extreme cases results in flows transitioning between choked and unchoked. This may be especially critical in the case of a venturi pump with high flow being dumped into the venturi line. In this case, the zone walls may be rigid or flexible.

Inlet coupling may occur if the set point in one zone is set sufficiently high such that there is a significant in-rush of flow into its manifold, resulting in a drop of line pressure, i.e. transient behavior. This line pressure drop may affect all the other zones fed by the source. Again, the zone walls may be rigid or flexible.

A system with only one zone and rigid walls may be considered as a "non-coupled, single-zone system." Multiple instances of such a rigid zone that are fed by independent inlets and that dump into independent exhausts may be an example of a "non-coupled, multi-zone system." A single zone with flexible walls that can expand or contract may be considered to be a "coupled, single-zone system." The illustrative embodiments shown in FIGS. 1 and 2 may be a "coupled, multi-zone systems," in which the level of coupling may be quantified based on inlet, outlet, and volumetric coupling.

The zone pressure estimator 120 may estimate the pressure in each of the zones $Z_i$ by using the pressure measurements of the pressure sensors 114, the physical parameters of each enclosure (e.g. measurement chamber) and each zone, and a model-based algorithm (described below) to accurately estimate the pressure of the zones $Z_i$. As a direct consequence, a pressure control system that uses the zone pressure estimator 120 in a closed loop for controlling the pressure in the zones $Z_i$ may overcome localized pressure transients in the measurement chambers that may not occur in the zones $Z_i$ themselves. In this way, the closed-loop control performance of the pressure control system may significantly improve.

The zone pressure estimator 120 may easily integrate into an advanced control system, and may compensates for multiple zones $Z_i$ that exhibit static and/or dynamic coupling of inlet pressure/flow, outlet pressure/flow, and zone volume interaction. The zone pressure estimator 120 places no restrictions on the size or volumes of the remotes zones $Z_i$. The zone pressure estimator 120 is valid for different ranges of pressure set points and, when incorporated into an advanced control system, will ensure consistent transient and steady-state behavior.

Control Algorithm

The controller 130 is configured to receive the pressure set point for each of the i zones, receive the zone pressure estimate for each of the i zones from the zone pressure estimator 120, and to regulate the pressure in each zone in accordance with pressure set point by operating the inlet and outlet proportional valves by controlling the flow of the fluid into and out of the measuring chamber connected to zone i.

As described earlier, the controller 130 may send an input flow command signal to the inlet proportional valve of enclosure $b_i$ and an output flow command signal to the output proportional valve of enclosure $b_i$ so as to control the input flow rate into enclosure i and the output flow rate out of enclosure $b_i$ according to the input flow command signal and the output flow command signal, respectively.

As described earlier, for one or more of the enclosures $b_i$, the controller may effect PI control of the input flow rate and the output flow rate, although other types of proportional valve control may also be used. When PI control is implemented, the input flow command signal from the controller to the inlet proportional valve of an enclosure i may be given by:

$$Q_{in,i} = \bullet_{Pin}(P_t - P_{z,i}) + \bullet_{Iin}\int(P_t - P_{z,i})dt,$$

and the output flow command signal from the controller to the outlet proportional valve of enclosure $b_i$ may be given by:

$$Q_{out,i} = \bullet_{Pout}(P_t - P_{z,i}) + \bullet_{Iout}\int(P_t - P_{z,i})dt.$$

In the above equations, denotes the input flow rate into enclosure i, $Q_{out,i}$ denotes the output flow rate out of enclosure $b_i$, $\bullet_{Pin}$ denotes a proportional gain for the input flow rate, $\bullet_{Iin}$ denotes an integral gain for the input flow rate, $\bullet_{Pout}$ denotes a proportional gain for the output flow rate, $\bullet_{Iout}$ denotes an integral gain for the output flow rate, $P_{z,i}$ denotes the estimated pressure within the zone $Z_i$, $P_t$ denotes a desired pressure trajectory from one pressure setpoint to another pressure setpoint, and $P_t - P_{z,i}$; denotes a tracking error. The pressure trajectories $P_t$ may be constructed using a number of techniques, including but not limited to polynomials, and solutions of first or higher order differential equations.

Whereas a PI type control system and method is illustrated and described in the particular embodiment of the present disclosure, it will be appreciated that numerous changes and modifications will occur to those skilled in the art—for example, the inclusion of feedforward terms that may be model-based. Accordingly, it is intended that the appended claims cover all those changes and modifications which fall within the true spirit and scope of the present disclosure.

One example of a model-based computational method used to operate the zone pressure estimator 120 to estimate the pressure in each zone is described below. This model-based computational method may be based upon the dynamics of the measurement chambers, as well as the dynamics and volumetric coupling of the remote zones $Z_i$, described below.

Measurement Chamber Dynamics

The effective pressure inside each measurement $b_i$ is defined as:

$$\frac{dP_{b,i}}{dt} = \frac{P_{STP}}{V_{b,i}}(Q_{in,i} - Q_{o,i} - Q_{z,i}) \; \forall \; i = 1, 2, \ldots, N, \quad (1)$$

where $P_{b,i}$ is the pressure measured by the pressure transducer 114 in the measurement chamber for the $i^{th}$ zone, $P_{STP}$ is the pressure at standard temperature and pressure (STP) conditions, $Q_{in,i}$ denotes the input flow and $Q_{o,i}$ and $Q_{z,i}$ denote the output flows. Specifically, $Q_{o,i}$ is the flow from the $i^{th}$ measurement chamber $b_i$ to the venturi manifold, and $Q_{z,i}$ is the flow to the $i^{th}$ zone. In (1), $V_{b,i}$ denotes the volume of the measurement chamber $b_i$ for the $i^{th}$ zone.

The output flow to the flow constrictor or venturi manifold "man" can be represented as:

$$Q_{o,i} = f(P_{b,i}, P_{man}, d_{orifice,i}) \; \forall i = 1, 2, \ldots, N, \quad (2)$$

where $d_{orifice,i}$ denotes the diameter of the fixed orifice in the measurement chamber that feeds the venturi manifold and $P_{man}$ denotes the pressure in the venturi manifold connected to the vacuum exhaust 30. The flow through the orifice may be choked or unchoked depending on the pressure differential across the fixed orifice.

Zone Dynamics and Volumetric Coupling

The flow to each zone $Z_i$ can be described by the following dynamic equation (derived from the Navier-Stokes equations)

$$\frac{dQ_{z,i}}{dt} = (P_{b,i} - P_{z,i})C_{tube,i} - \frac{Q_{z,i}}{\tau_{tube,i}} \; \forall \; i = 1, 2, \ldots, N, \quad (3)$$

where $Q_{z,i}$ and $P_{z,i}$ denote the inlet flow to and the pressure in the ith zone, respectively, and $C_{tube,i}$ and $\tau_{tube,i}$ are constants associated with the conduit $F_i$ that connects the measurement chamber $b_i$ to the zone $Z_i$. In particular, $C_{tube,i}$ represents a conductance of the conduit $F_i$, in SI units $[(m^3/s)/(s\text{-}Pa)]$ and $\tau_{tube,i}$ representing a flow equilibration time constant across the conduit, also in SI units.

The pressure dynamics within each zone $Z_i$ can be described as follows:

$$\frac{dP_{z,i}}{dt} = \frac{P_{STP}}{V_{z,i}}Q_{z,i} - \frac{P_{z,i}}{V_{z,i}}\frac{dV_{z,i}}{dt}, \quad (4)$$

where the volume of each zone $Z_i$ is denoted by $V_{z,i}$ and the dynamic volume interaction due to the coupling between the multiple zones $Z_i$ can be mathematically described as follows:

$$\tau_v \frac{dV_{z,i}}{dt} + V_{z,i} = \left[ V_{Z0,i} + \gamma_{ii}(P_{z,i} - P_{STP}) + \sum_{i \neq j} \gamma_{ij}(P_{z,i} - z_{,j}) \right], \quad (5)$$

where $V_{z0,i}$ the initial volume of each zone under standard temperature and pressure (STP) conditions, $\tau_v$ is the volume expansion/contraction time constant, $\gamma_{ii}$ represents the expansion/contraction coefficient, and $\gamma_{ij}$ represents the coupling coefficient between zone i and zone j. Mass/inertial effects may be assumed to be negligible.

Zone Pressure Estimator

As explained earlier, the control objective for the controller 130 is to regulate the pressures within the remote zones $Z_i$. However, the pressure transducer 114 for $b_i$ is housed in the measurement chamber $b_i$, as opposed to in the zone $Z_i$. As seen in FIG. 2, the measurement chambers $b_i$ are separated from the remote zones $Z_i$ by conduits $F_i$.

The observer-based model for the pressure control algorithm may be developed in a number of ways. For example, a flow sensor (e.g., an anemometer, thermal-based sensor, pressure-based sensor, etc.) may be used to determine the flow $Q_{z,i}$ in the above equations. Another approach may be to develop an intermediate flow observer by rewriting the zone flow equation in its discrete form:

$$\hat{Q}_{z,i}^{(n)} = \frac{\hat{Q}_{z,i}^{(n-1)} + \Delta t C_{pipe,i} \left( P_{b,i}^{(n)} - \hat{P}_{z,i}^{(n-1)} \right)}{\left( 1 + \frac{\Delta t}{\tau_{pipe,i}} \right)}, \quad (6)$$

where $\hat{Q}_{z,i}^{(n)}$ denotes the nth sample of the flow estimate to the ith zone, and $P_b$ is the pressured measured by the flow line pressure transducer 114.

A discrete solution for the expression in (5) may then be obtained as follows:

$$\hat{V}_{z,i}^{(n)} = \frac{\hat{V}_{z,i}^{(n-1)} + \frac{\Delta t}{\tau_v} \left[ \begin{array}{c} V_{z0,i} + \gamma_{ii}\left(\hat{P}_{z,i}^{(n-1)} - P_{STP}\right) + \\ \sum_{i \neq j} \gamma_{ij}\left(\hat{P}_{z,i}^{(n-1)} - \hat{P}_{z,j}^{(n-1)}\right) \end{array} \right]}{\left( 1 + \frac{\Delta t}{\tau_v} \right)}, \quad (7)$$

where $\hat{V}_{z,i}^{(n)}$ denotes the nth sample of the volume estimate to the ith zone. Based on the above equations, the algorithm of the pressure estimator 120 is constructed as follows:

$$\hat{P}_{z,i}^{(n)} = \hat{P}_{z,i}^{(n-1)} + \Delta t \left( \frac{P_{STP}}{\hat{V}_{z,i}^{(n)}} \hat{Q}_{z,i}^{(n)} + \frac{\hat{P}_{z,i}^{(n-1)}}{\tau_v \hat{V}_{z,i}^{(n)}} \left[ \begin{array}{c} \hat{V}_{z,i}^{(n)} - V_{z0,i} - \gamma_{ii}\left(\hat{P}_{z,i}^{(n-1)} - P_{STP}\right) - \\ \sum_{i \neq j} \gamma_{ij}\left(\hat{P}_{z,i}^{(n-1)} - \hat{P}_{i,j}^{(n-1)}\right) \end{array} \right] \right), \quad (8)$$

where $\hat{P}_{z,i}^{(n)}$ denotes the nth sample of a pressure estimate of the ith zone, $\hat{Q}_{z,j}^{(n)}$ is obtained from the flow estimate defined in (6) or can be replaced by the direct flow measurement $Q_z$ when available, and $\hat{V}_{z,j}^{(n)}$ is obtained from (7).

In sum, a system and method have been described for controlling pressure in remote zones by accurately estimating the pressure of the remote zone whose pressure is being controlled. The pressure control system and method described above can be used in numerous applications, including but not limited to a CMP machine.

While certain embodiments have been described of a system and method for controlling pressure in remote zones, it is to be understood that the concepts implicit in these embodiments may be used in other embodiments as well. The protection of this application is limited solely to the claims that now follow.

In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A system for remotely controlling pressure within each of i zones respectively connectable to i measurement chambers through conduits i, by controlling flow of a fluid into and out of each measurement chamber i, and through each conduit i into each zone i, wherein i=1, ..., N, the system comprising:
   a plurality of measurement chambers, i, wherein each measurement chamber is controllably closable by operation of an inlet proportional valve and outlet proportional valve connected to the measurement chamber, wherein each outlet proportional valve is connected to a vacuum exhaust, and wherein the plurality of measurement chambers, i, are connected to one another at the respective outputs of the proportional valves by a flow constrictor manifold;
   a plurality of zones i, wherein each zone is connected to a respective measurement chamber through a respective conduit, wherein each zone is a remote zone relative to the respective measurement chamber;
   a pressure measurement system configured to measure pressure of the fluid in each of the i measurement chambers;
   a valve system including, for each measurement chamber i, at least one inlet proportional valve configured to regulate an input flow rate of the fluid into the measurement chamber i, and at least one outlet proportional valve configured to regulate an output flow rate of the fluid out of the measurement chamber i;
   a zone pressure estimator coupled to the pressure measurement system and configured to, for each zone i, receive a measured pressure in the measurement chamber i from the pressure measurement system, and compute an estimated pressure within the zone i as a function of the measured pressure in the measurement chamber i, and as a function of known characteristics of the conduit i and the zone i; and
   a controller configured to control pressure within each zone i by operating the inlet proportional valve and the outlet proportional valve of each measurement chamber i so as to control the input flow rate of the fluid into the measurement chamber i and the outlet flow rate of the fluid out of the measurement chamber i as a function of a pressure set point for the zone i and the estimated pressure within the zone i from the zone pressure estimator, wherein the controller is further configured to, for each zone, effect PI (Proportional-Integral) control of the input flow rate and the output flow rate;

wherein the pressure measurement system comprises a plurality of pressure sensors, each of the pressure sensors respectively connected to measure pressure within the i measurement chambers;

wherein at least some of the i zones have flexible walls that allow the zones having the flexible walls to expand and to contract, wherein at least some of the i zones are coupled, and wherein the known characteristics of the i conduits include constants $C_{tube,i}$ and $\tau_{tube,i}$ associated with each conduit i connecting the line i to the zone i, $C_{tube,i}$ representing a conductance of the conduit, and $\tau_{tube,i}$ representing a flow equilibration time constant across the conduit; and wherein the known characteristics of the i zones include an initial volume ($V_{z0,i}$) of each zone i under STP (Standard Temperature and Pressure) conditions, a volume expansion/contraction time constant ($\tau_v$), an expansion/contraction coefficient ($\gamma_{ii}$) of zone i, and a coupling coefficient ($\gamma_{ij}$) between zone i and zone j, where j=1, ..., N.

2. The system of claim 1, wherein the zone pressure estimator is further configured to compute an estimated volume of each of the zones with flexible walls so as to compute the estimated pressure within enclosures that are connected to the zones with flexible walls.

3. The system of claim 1, wherein at least some of the i zones are coupled.

4. The system of claim 1, wherein for each zone i, the zone pressure estimator is programmed to calculate an nth sample $\hat{P}_{z,i}^{(n)}$ of the estimated pressure of the zone i, an nth sample $\hat{V}_{z,i}^{(n)}$ of an estimated volume of the zone i, and an nth sample $\hat{Q}_{z,i}^{(n)}$ of an estimated input flow rate into an enclosure i; and wherein $$\hat{P}_{z,i}^{(n)} = \hat{P}_{z,i}^{(n-1)} + \Delta t \left( \frac{P_{STP}}{\hat{V}_{z,i}^{(n)}} \hat{Q}_{z,i}^{(n)} + \frac{\hat{P}_{z,i}^{(n-1)}}{\tau_v \hat{V}_{z,i}^{(n)}} \left[ \hat{V}_{z,i}^{(n)} - V_{z0,i} - \gamma_{ii}(\hat{P}_{z,i}^{(n-1)} - P_{STP}) - \sum_{i \neq j} \gamma_{ij}(\hat{P}_{z,i}^{(n-1)} - \hat{P}_{i,j}^{(n-1)}) \right] \right),$$

$$\hat{Q}_{z,i}^{(n)} = \frac{\hat{Q}_{z,i}^{(n-1)} + \Delta t C_{pipe,i}(P_{b,i}^{(n)} - \hat{P}_{z,i}^{(n-1)})}{\left(1 + \frac{\Delta t}{\tau_{pipe,i}}\right)},$$

$$\hat{V}_{z,i}^{(n)} = \frac{\hat{V}_{z,i}^{(n-1)} + \frac{\Delta t}{\tau_v}\left[V_{z0,i} + \gamma_{ii}(\hat{P}_{z,i}^{(n-1)} - P_{STP}) + \sum_{i \neq j} \gamma_{ij}(\hat{P}_{z,i}^{(n-1)} - \hat{P}_{z,j}^{(n-1)})\right]}{\left(1 + \frac{\Delta t}{\tau_v}\right)},$$

and wherein $P_{bi}$ denotes the pressure measured by the pressure sensor connected to enclosure i, wherein $Q_{zi}$ denotes an input flow rate of the fluid into zone i that is given by a different between the input flow rate $Q_{in,i}$ of the fluid into enclosure i and the output flow rate $Q_{out,i}$ of the fluid out of enclosure i.

5. A machine including the system of claim 4, and further including the i zones respectively connected to i enclosures.

6. The machine of claim 4, further comprising a CMP carrier head containing the i zones.

* * * * *